United States Patent
Yehezkely

(10) Patent No.: US 11,329,658 B2
(45) Date of Patent: *May 10, 2022

(54) OSCILLATOR CALIBRATION FROM OVER-THE AIR SIGNALS

(71) Applicant: Wiliot, Ltd., Caesarea (IL)

(72) Inventor: Alon Yehezkely, Haifa (IL)

(73) Assignee: Wiliot, Ltd., Caesarea (IL)

(*) Notice: Subject to any disclaimer, the term of this patent is extended or adjusted under 35 U.S.C. 154(b) by 0 days.

This patent is subject to a terminal disclaimer.

(21) Appl. No.: 17/068,275

(22) Filed: Oct. 12, 2020

(65) Prior Publication Data

US 2021/0083680 A1    Mar. 18, 2021

Related U.S. Application Data

(63) Continuation of application No. 15/994,388, filed on May 31, 2018, now Pat. No. 10,886,929.

(51) Int. Cl.
*H03L 7/099* (2006.01)
*H03L 7/08* (2006.01)
(Continued)

(52) U.S. Cl.
CPC .......... *H03L 7/0992* (2013.01); *H03B 28/00* (2013.01); *H03L 7/0802* (2013.01); *H03L 7/099* (2013.01);
(Continued)

(58) Field of Classification Search
CPC ........... H03B 28/00; H03B 2200/0074; H03B 2200/0062; H03L 7/0802; H03L 7/0992; H03L 7/181; H03J 2200/11
(Continued)

(56) References Cited

U.S. PATENT DOCUMENTS 6,380,835 B1  4/2002  Lee
6,670,852 B1  12/2003 Hauck
(Continued)

FOREIGN PATENT DOCUMENTS

CA    2018264 C    3/1996
CN    104604124 A  5/2015
(Continued)

OTHER PUBLICATIONS

International Search Report and Written Opinion of International Searching Authority for PCT/US2019/023176, ISA/RU, Moscow, Russia, dated Aug. 6, 2019.
(Continued)

*Primary Examiner* — Arnold M Kinkead
(74) *Attorney, Agent, or Firm* — M&B IP Analysts, LLC

(57) ABSTRACT

An oscillator calibration circuit is presented. The oscillator calibration includes a first frequency locking circuit (FLC) coupled to a first oscillator, wherein the first FLC calibrates the frequency of the first oscillator using an over-the-air reference signal, wherein the first FLC calibrates the first oscillator prior to a data transmission session and remains free running during the data transmission session; and a second FLC coupled to a second oscillator, wherein the second FLC calibrates the frequency of the second oscillator using the over-the-air reference signal, wherein the second FLC calibrates the second oscillator immediately prior to a data transmission session and remains free running during the data transmission session.

17 Claims, 6 Drawing Sheets

(51) Int. Cl.
*H03B 28/00* (2006.01)
*H03L 7/181* (2006.01)
*H03L 7/23* (2006.01)

(52) U.S. Cl.
CPC ............... *H03L 7/181* (2013.01); *H03L 7/23* (2013.01); *H03B 2200/0062* (2013.01); *H03B 2200/0074* (2013.01); *H03J 2200/11* (2013.01); *H03L 2207/06* (2013.01)

(58) Field of Classification Search
USPC .......... 331/44, 2, 46, 18; 455/260; 340/10.1, 340/10.3
See application file for complete search history.

(56) References Cited

U.S. PATENT DOCUMENTS

| | | | |
|---|---|---|---|
| 6,922,128 | B2 | 7/2005 | Vilander et al. |
| 7,130,368 | B1 | 10/2006 | Aweya et al. |
| 7,800,457 | B2 | 9/2010 | Unkrich et al. |
| 7,898,343 | B1 * | 3/2011 | Janesch ............... H03L 7/0891 331/16 |
| 8,942,315 | B1 | 1/2015 | Wang et al. |
| 10,700,718 | B2 | 6/2020 | Shapira et al. |
| 10,886,929 | B2 * | 1/2021 | Yehezkely ............ H03L 7/0802 |
| 2003/0078013 | A1 | 4/2003 | Ferguson |
| 2005/0007204 | A1 | 1/2005 | Howe et al. |
| 2006/0049982 | A1 | 3/2006 | Wells |
| 2007/0205871 | A1 | 9/2007 | Posamentier |
| 2009/0140383 | A1 | 6/2009 | Chang et al. |
| 2014/0191815 | A1 * | 7/2014 | Mirzaei ............... H03L 7/06 331/1 A |
| 2017/0265164 | A1 | 9/2017 | Wiser |
| 2019/0227144 | A1 | 7/2019 | Lin et al. |

FOREIGN PATENT DOCUMENTS

| | | |
|---|---|---|
| CN | 106416079 A | 2/2017 |
| CN | 107707254 A | 2/2018 |
| EP | 2978133 A1 | 1/2016 |
| EP | 3285400 A1 | 2/2018 |

OTHER PUBLICATIONS

Jae-Seung, et al., "Energy-Efficient RF Systems /13.1", 2015 IEEE International Solid-State Circuits Conference, Session 13, pp. 234-236.

Masuch, et al., "A 1.1-mW-RX-81.4-dBm Sensitivity CMOS Transceiver for Bluetooth Low Energy", IEEE Transactions on Microwave Theory and Techniques, vol. 61., No. 4, Apr. 2013, pp. 1660-1673.

The Extended European Search Report and Search Opinion for European Application No. 19810856.5, dated Nov. 4, 2021, European Patent Office (EPO), Munich, Germany.

The First Office Action for Chinese Patent Application No. 201980022927.6, dated May 18, 2021, Chinese National Intellectual Property Administration, Beijing City, China.

The Second Office Action for Chinese Patent Application No. 201980022927.6, dated Dec. 28, 2021, Chinese National Intellectual Property Administration, Beijing City, China.

* cited by examiner

OSCILLATOR CALIBRATION FROM OVER-THE AIR SIGNALS

CROSS REFERENCE TO RELATED APPLICATIONS

This application is a continuation application of U.S. patent application Ser. No. 15/994,388 filed May 31, 2020 (now U.S. Pat. No. 10,886,929), now allowed. The contents of which are incorporated herein by reference.

TECHNICAL FIELD

The present disclosure generally relates to calibrating oscillators of low-power transmitters operable of Internet of things (IoT) devices.

BACKGROUND

The Internet of things (IoT) is the inter-networking of physical devices, vehicles, buildings, and other items embedded with electronics, software, sensors, actuators, and network connectivity that enable these objects to collect and exchange data. IoT is expected to offer advanced connectivity of devices, systems, and services that goes beyond machine-to-machine (M2M) communications and covers a variety of protocols, domains, and applications.

IoT can be encapsulated in a wide variety of devices, such as heart monitoring implants; biochip transponders on farm animals; automobiles with built-in sensors; automation of lighting, heating, ventilation, air conditioning (HVAC) systems; and appliances such as washer/dryers, robotic vacuums, air purifiers, ovens or refrigerators/freezers that use Wi-Fi for remote monitoring. Typically, IoT devices encapsulate wireless sensors or a network of such sensors.

Most IoT devices are wireless devices that collect data and transmit such data to a central controller. There are a few requirements to be met to allow widespread deployment of IoT devices. Such requirements include reliable communication links, low energy consumption, and low maintenance costs.

To this aim, an IoT device and connected wireless sensors are designed to support low power communication protocols, such as Bluetooth low energy (BLE), LoRa, and the like. However, IoT devices utilizing such protocols require a battery, e.g., a coin battery. The reliance on a power source (e.g., a battery) is a limiting factor for electronic devices, due to, for example, cost, size, lack of durability to environmental effects, and frequent replacement. As an alternative to using batteries, power may be harvested from sources such as light, movement, and electromagnetic power such as existing radio frequency transmissions. In order to minimize the power consumption, IoT devices are designed with the minimum required components or implementing low-power consumption oscillators.

FIG. 1 schematically illustrates a standard BLE transmitter 100 including a BLE packetizer 110, an oscillator 120, a power source 130, an amplifier 140, and an antenna 150. These components allow for transmission of wireless signals from the BLE transmitter 100.

The BLE standard defines 40 communication channels from 2.4000 GHz to 2.4835 GHz. Out of the 40 channels, 37 channels are used for communicating data and the last three channels (37, 38, and 39) are used as advertising channels to set up connections and send broadcast data. The BLE standard defines a frequency hopping spread spectrum technique in which the radio hops between channels on each connection event. A broadcaster device may advertise on any one of the 3 advertisement channels. The modulation scheme defined for the BLE standard is a Gaussin frequency shift keying (GFSK) modulation. To this end, within each channel, a frequency deviation greater than 185 KHz above the carrier frequency corresponds to a bit with a binary value '1' and a frequency deviation less than −185 KHz corresponds to a bit with a binary value '0'.

The BLE packetizer 110 may receive a signal originated from a processor of a host device. Such a signal may include data or control parameters included in the signal transmitted by the BLE transmitter 100.

The oscillator 120 generates a radio frequency (RF) carrier signal that may carry the data signal generated by the BLE packetizer 110. The modulated RF signal, carrying the data signal, is amplified by the amplifier 140 and then broadcast by the antenna 150. The power source 130 may be a battery.

The oscillator 120 may be a free-running oscillator, which may be used to directly generate an RF carrier signal. Thus, a free-running oscillator may replace a frequency synthesizer to generate an RF carrier signal. Utilization of a free-running oscillator may result in power savings. In the BLE transmitter 100, the free-running oscillator generates a RF carrier signal having a frequency within a specific portion of the wireless spectrum, e.g., the 2.4 GHz wireless spectrum.

Typically, the free running oscillator is locked via a phase-locked loop (PLL) to a clock, originating from a crystal oscillator. The crystal oscillator has a resonator 121 that may be also included on a board hosting the processor of the IoT device. The resonator 121 is typically a crystal resonator, a quartz resonator, or microelectromechanical systems (MEMS) based resonator which typically provides a sufficiently accurate and stable time/frequency reference. However, for low-cost, ultra low-power, and small form-factor IoT devices, it is desirable to omit such a resonator.

Some devices, such as radio frequency identification (RFID) devices, use an external signal as a reference signal. Typically, an RFID reader demodulates a received signal onto the carrier wave transmitted to RFID tags. An RFID tag receiving the carrier wave reference signal can synchronize its own transmission based on such a signal. The RFID does not time the transmission, but merely transmits data as the reference signal is received. This synchronization solution cannot work in BLE transmitters where transmission occurs in specific sessions. Further, RFID readers and tags do not manipulate signals received over-the-air to serve as an RF carrier signal for BLE transmission.

It would therefore be advantageous to provide solution to design a transmitter without a resonator that would overcome the challenges noted above.

SUMMARY

A summary of several example embodiments of the disclosure follows. This summary is provided for the convenience of the reader to provide a basic understanding of such embodiments and does not wholly define the breadth of the disclosure. This summary is not an extensive overview of all contemplated embodiments, and is intended to neither identify key or critical elements of all embodiments nor to delineate the scope of any or all aspects. Its sole purpose is to present some concepts of one or more embodiments in a simplified form as a prelude to the more detailed description that is presented later. For convenience, the term "certain embodiments" may be used herein to refer to a single embodiment or multiple embodiments of the disclosure.

Certain embodiments disclosed herein include an oscillator calibration circuit oscillator calibration circuit comprising: a first frequency locking circuit (FLC) coupled to a first oscillator, wherein the first FLC calibrates the frequency of the first oscillator using an over-the-air reference signal, wherein the first FLC calibrates the first oscillator prior to a data transmission session and remains free running during the data transmission session; and a second FLC coupled to a second oscillator, wherein the second FLC calibrates the frequency of the second oscillator using the over-the-air reference signal, wherein the second FLC calibrates the second oscillator immediately prior to a data transmission session and remains free running during the data transmission session.

BRIEF DESCRIPTION OF THE DRAWINGS

The subject matter disclosed herein is particularly pointed out and distinctly claimed in the claims at the conclusion of the specification. The foregoing and other objects, features, and advantages of the disclosed embodiments will be apparent from the following detailed description taken in conjunction with the accompanying drawings.

DETAILED DESCRIPTION

Figure 1:
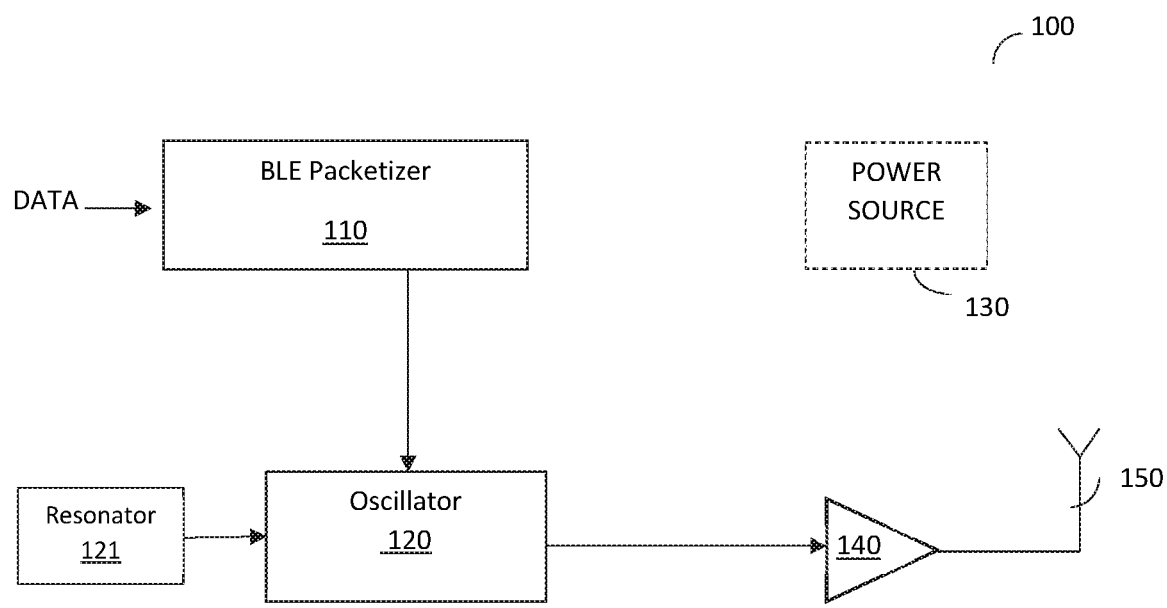
FIG. 1 is a schematic diagram of a BLE transmitter.

It is important to note that the embodiments disclosed herein are only examples of the many advantageous uses of the innovative teachings herein. In general, statements made in the specification of the present application do not necessarily limit any of the various claimed embodiments. Moreover, some statements may apply to some inventive features but not to others. In general, unless otherwise indicated, singular elements may be in plural and vice versa with no loss of generality. In the drawings, like numerals refer to like parts through several views.

Some of the disclosed embodiments include an oscillator calibration circuit for calibrating oscillators in a BLE transmitter. The oscillator's frequency is locked during a session immediately prior to transmitting data, and remains free running during the transmit session.

Figure 2:
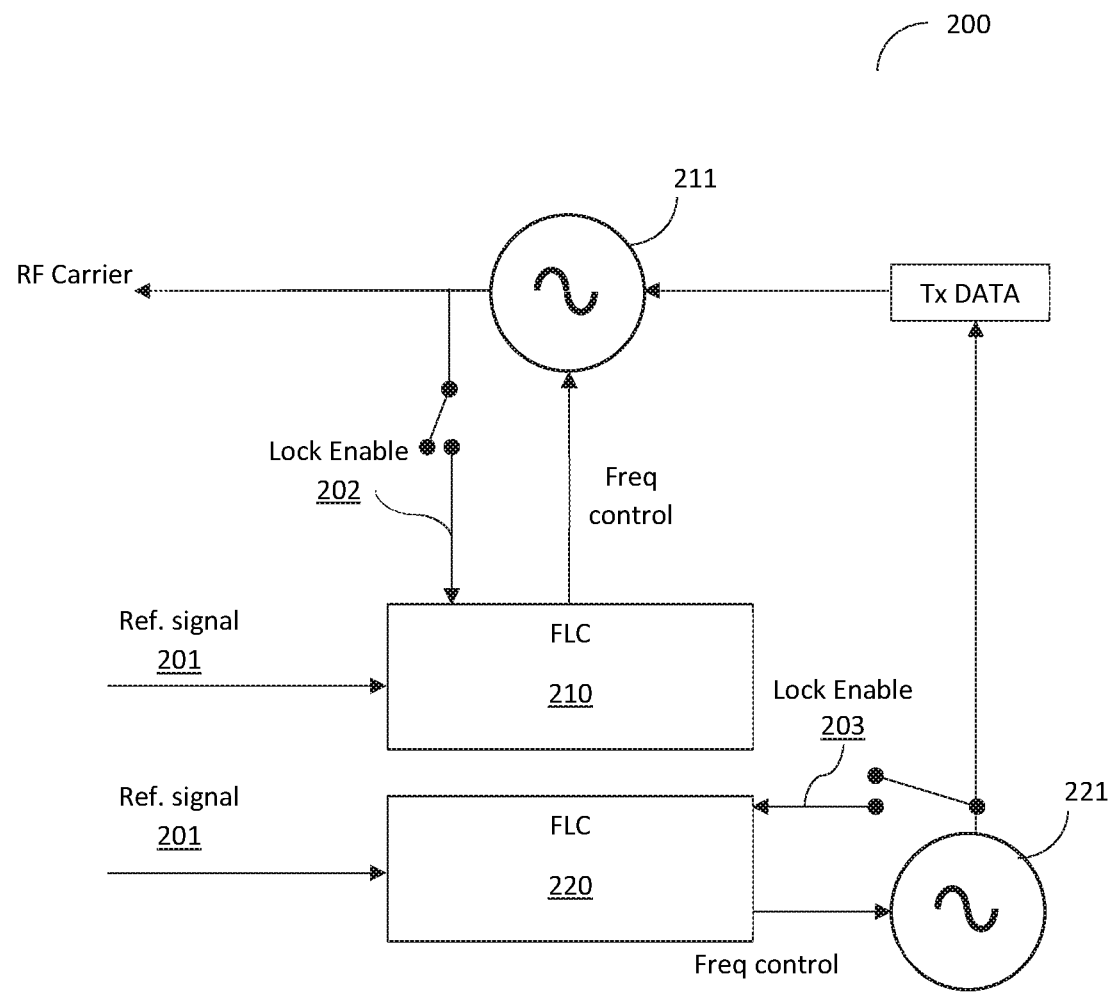
FIG. 2 is a block diagram of an oscillator calibration circuit according to an embodiment.
Figure 3A:
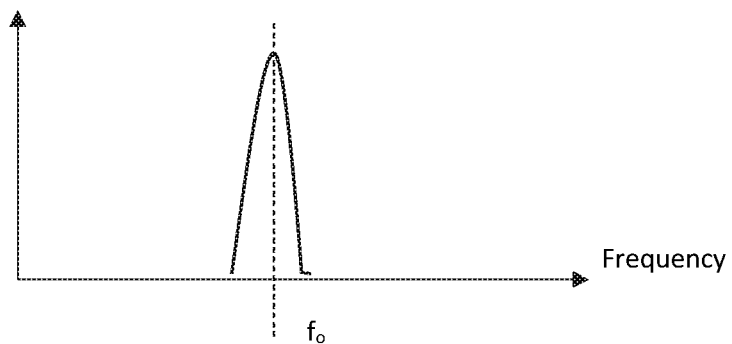
FIG. 3A through 3D demonstrates the calibration points according to an embodiment.
Figure 3B:
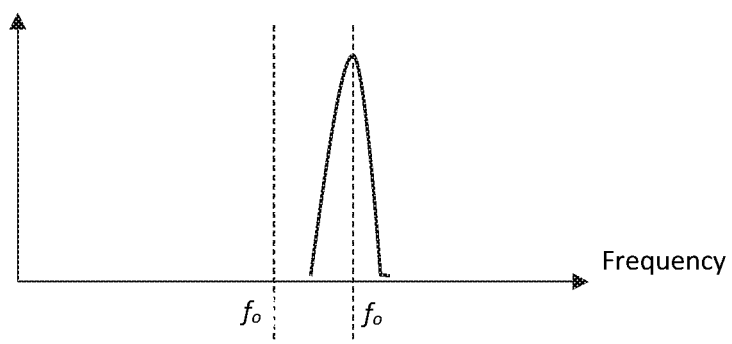
Figure 3C:
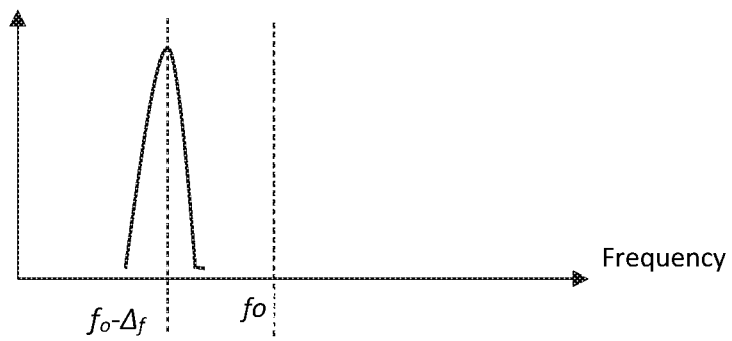
Figure 3D:
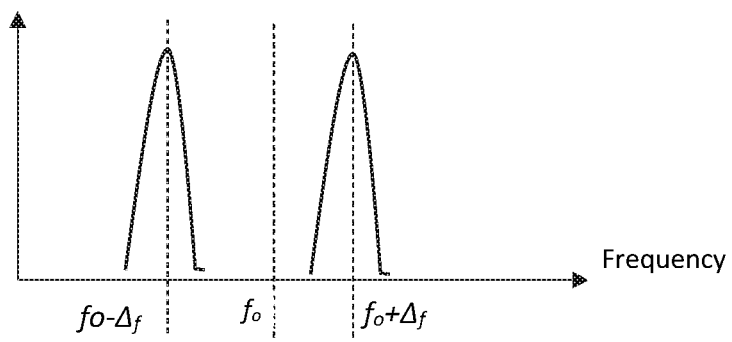

FIG. 2 shows an example block diagram of an oscillator calibration circuit 200 designed according to an embodiment. The oscillator calibration circuit 200 includes two frequency locking circuits (FLC) 210 and 220 for calibrating the frequency of oscillators 211 and 221, respectively. The oscillators 211 and 221 are on-die oscillators, i.e., that are incorporated as part of a BLE transmitter. In an embodiment, the oscillator 211 is a local oscillator calibrated to a single point carrier frequency (FIG. 3A). In another embodiment, the oscillator 211 can be calibrated to a (single point) carrier frequency ($f_o$) with a positive offset frequency value of $\Delta_f$ (FIG. 3B). In yet another embodiment, the oscillator 211 can be calibrated to a (single point) carrier frequency ($f_o$) with a negative offset frequency value $\Delta_f$ (FIG. 3C). In yet another embodiment, the oscillator 211 can be calibrated to two calibration points: a carrier frequency ($f_o$) with a negative offset frequency value $\Delta_f$ and a carrier frequency ($f_o$) with a positive offset frequency value $\Delta_f$ (FIG. 3D). In the BLE protocol, $\Delta_f$ is the frequency deviation utilized to distinguish between values of '1' and '0' and is set to about 185 KHz. The carrier frequency ($f_o$) is a frequency of one of a BLE advertisement channels. For example, the carrier frequency may be 2.4 GHz.

In another embodiment, the local oscillator 211 can be calibrated to an intermediate frequency (IF) frequency signal. For example, the frequency of such a signal would be 24 MHz. The IF signal can be utilized for backscattering the signal on, for example, a BLE backscatter packet.

Returning to FIG. 2. the oscillator 221 is a symbol oscillator configured to generate a symbol signal having a frequency of 1 MHz. The symbol signal is utilized to modulate the data to be transmitted.

It should be noted that the calibration of the oscillators 211 and 221 by their respective FLCs 210 and 220 can be performed sequentially (one after the other, in any order) or in parallel. In an example implementation, each of the oscillators 211 and 221 may be realized as a digitally controlled oscillator (DCO).

Each of the FLCs 210 and 220 receives the oscillator signal as feedback, 202 and 203 respectively. The signals may be enabled from a controller (not shown) and configured to enable a frequency lock of the oscillators 211 and 221 prior to transmission sessions. In another embodiment, the feedback signals are enabled upon detection of over-the-air signals with a predefined frequency (e.g., 2.4 GHz). During transmission sessions, the signals 202 and 203 disenable the FLCs 210 and 220, hence the frequency locking. The switching between an enabled/disenabled state of the FLCs 210 and 220 is performed to reduce power consumption by the FLCs 210 and 220 and to reduce the frequency drift of the oscillators.

Specifically, during transmission sessions when the FLCs 210 and 220 are disenabled, these circuits are not powered, reducing the power consumption by the BLE transmitter as the FLCs 210 and 220 are in a free running state. Further, this forces the FLCs 210 and 220 to relock the frequency prior to every transmission session and reduces the frequency drift of the transmitted signal, as the transmission occurs immediately after the oscillators are locked.

In an embodiment, the FLCs 210 and 220 are enabled for as long as the FLCs 210 and 220 are calibrated to a target frequency with a tolerance of a predefined frequency error. The frequency accuracy (or timing accuracy) is usually given in parts per million (ppm) of the nominal oscillator frequency.

The allowed predefined frequency error can be determined based on the allowed error defined in the specification of the BLE protocol. In another embodiment, the allowed error is determined based on a tolerance permitted by the receiving device. Such a tolerance may be configured in the BLE transmitter or learned over time. For example, for mission critical sensors, the allowed frequency error would be smaller than for non-mission critical sensors. In yet another embodiment, the calibration process performed by each of the FLCs can be timed out after a predefined time window and/or when the available energy is below a predefined threshold.

In an embodiment, the frequency accuracy, i.e., the allowed error may be different for each of the oscillators 211 and 221. For example, for the oscillator 211 (the local oscillator), the allowed error may be about 1000 ppm. The frequency accuracy error for the oscillator 221 (symbol oscillator) is stricter. For example, the oscillator's 221 allowed error is 50 ppm.

In an embodiment, the over-the-air reference signals can be derived from the constant-tone, modulated, and frequency-hopping signals. For example, such a reference signal may be a BLE advertisement packet signal, ultra-wideband (UWB) RFID reader signal in the 900 MHz bands, a 13.56 MHz RFID reader signal, a single tone reference at any of the industrial, scientific and medical (ISM) bands, a modulated reference at any of the ISM bands, and an RF signal in the Wi-Fi spectrum (2.4 GHz or 5 GHz bands). The ISM band may be in the 2.4 GHz band or 433 MHz band.

Each of the FLCs 210 and 220 can be implemented as a frequency locked loop (FLL), a phased locked loop (PLL), or a delay locked loop (DLL). In an example and non-limiting implementation, an FLL circuit that can be utilized according to an embodiment is provided in FIG. 4.

It should be appreciated that the oscillator calibration circuit 200 can be integrated in a BLE transmitter, including multiple antennas, each of which can serve a different purpose. For example, one antenna can be dedicated for power harvesting, another antenna to transmit the data, and yet another antenna for the reception of a reference signal.

Figure 4:
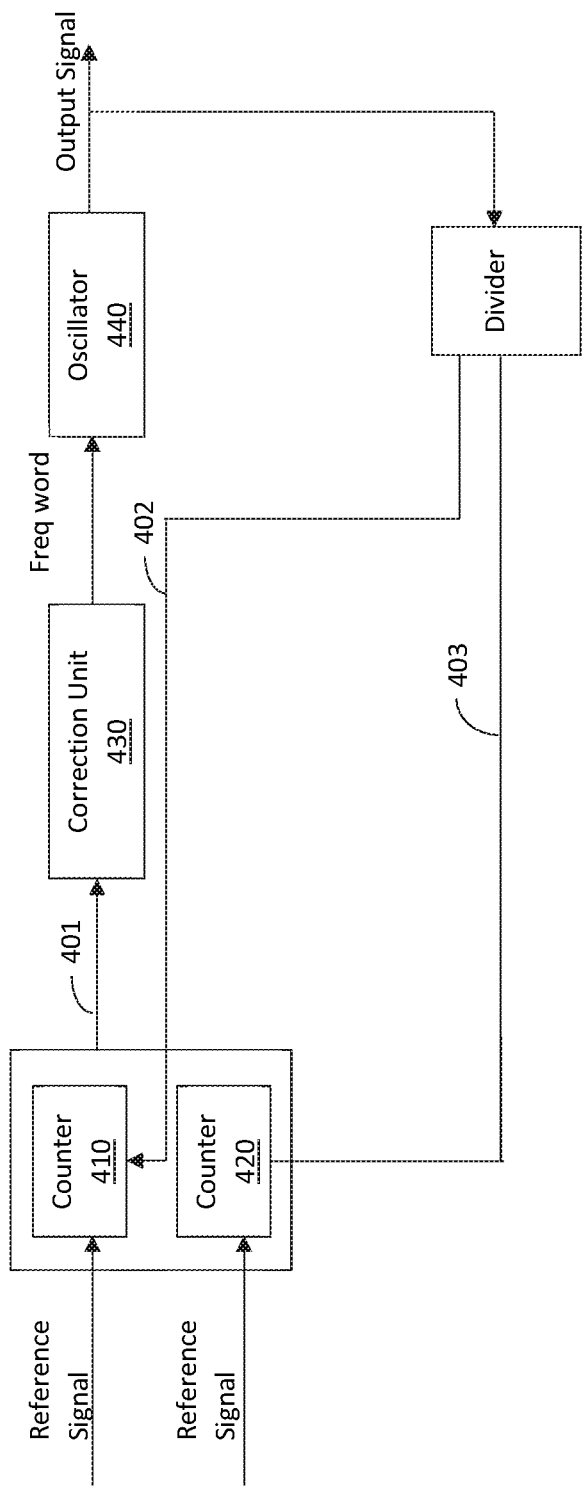
FIG. 4 is a block diagram of a frequency-locked loop (FLL) circuit utilized to describe the disclosed embodiments.

FIG. 4 shows an example block diagram of an FLL circuit 400 that can be utilized according to an embodiment. The example FLL circuit 400 includes a first counter 410, a second counter 420, and a correction unit 430 which is coupled to an oscillator 440. In this example, the oscillator 440 is a DCO.

The oscillator 440 provides a feedback to the counters 410 and 420, so that the digital frequency word (or byte) sets the oscillator 440 to oscillate in a frequency which is as close as possible to a fraction of the reference signal achieved via the counter (401) (e.g., 2.4 GHz). In this embodiment, the oscillator's 440 output is divided by two in order to generate two clocks signals (402 and 403) which have different phases. The clock signals serve as the enable signals for the counters 410 and 420. This enables continuous counting and updating the digital frequency word.

The counters 410 and 420 counts reference clock cycles within each cycle of the oscillator 440. For example, for a reference continuous wave of 2.4 GHz, 100 cycles are expected for 24 MHz. Specifically, the first counter 410 counts between positive edges of the clock 402 and the second counter 420 counts between negative edges of the clock signal 403. At positive edge of the clock signal 402, the counter 410 is preset to the target calibration value and counts during a full clock cycle. The counter's 410 value at the end of each clock cycle is proportional to the frequency offset between the oscillator 440 and the reference signal 401. A negative value means the oscillator 440 is faster than the reference signal, and a positive value means the oscillator 440 is slower than the reference signal. At the negative edge of the oscillator 440, the counter value is latched into the correction unit 430.

The second counter 420 is similarly driven by the clock signal 403, so while the value of the first counter 410 latched and propagated through the correction unit 430, the second counter 420 counts over the next full oscillator's 440 clock cycle to generate its count value. Thus, counters 410 and 420 operate alternately on clock cycles of the oscillator 440.

The correction unit 430 receives the count values which represent the frequency offset between the oscillator 440 and the reference signal 401. In an example embodiment, the count values are multiply by K (an integer value which is the power of 2) in order to translate the detector output to equivalent frequency units (Hertz). The correction unit 430 also averages the error to get better estimation. The output of the correction unit 430 is a digital frequency word having a predefined number of least significant bit (LSBs) that are not passed to the oscillator 440.

In an embodiment, the correction unit 430 can be realized as a wired logic gate, a microcontroller, a microprocessor, and the like. As noted above, the frequency locking is performed before the data transmission session. In an embodiment, at each frequency locking session the oscillator 440 can be set to a previous digital frequency word used to set the oscillator 440 in a previous locking session.

Figure 5:
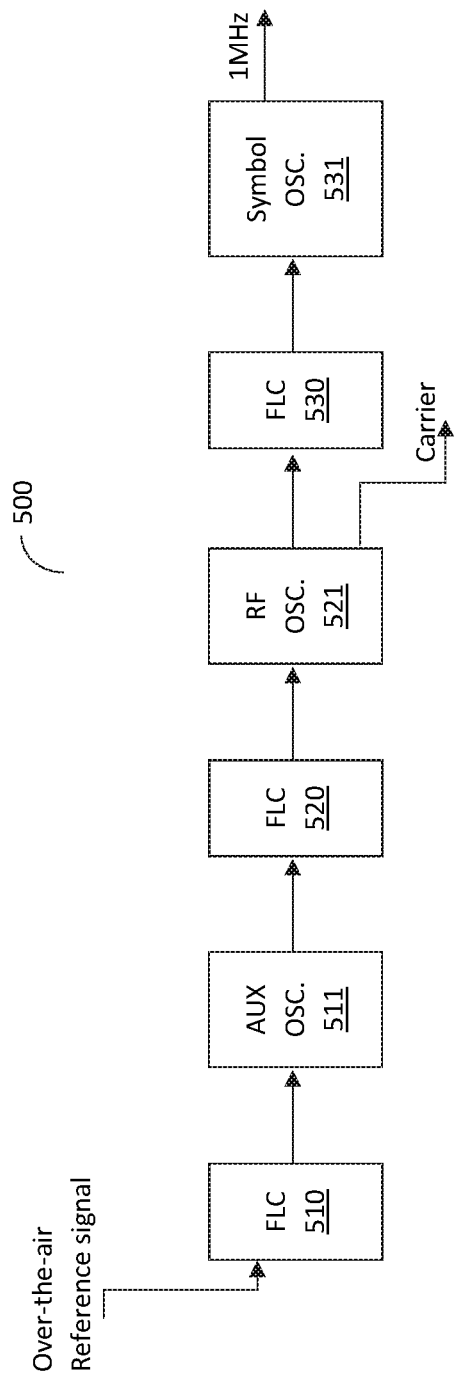
FIG. 5 is a block diagram of an oscillator calibration circuit designed according to another embodiment.

FIG. 5 shows an example oscillator calibration circuit 500 designed according to another embodiment. In this example embodiment, the oscillator calibration circuit 500 includes 3 FLCs 510, 520, and 530 respectively calibrating oscillators 511, 521, and 531. In this configuration, the calibration is performed sequentially.

Specifically, the FLC 510 calibrates an auxiliary oscillator 511 using an over-the-air reference signal 501. The signal 501 may be any type of the over-the-air signal mentioned above. The auxiliary oscillator 511 is calibrated to output an auxiliary signal 502 having a frequency of 1 MHz.

The auxiliary signal 502 serves as a reference signal to the FLC 520 which calibrates a local oscillator 521. According to one embodiment, the local oscillator 521 can be calibrated to output a single point carrier frequency or two points carrier frequencies as discussed with reference to FIGS. 3A-3D. Here, the output of the local oscillator 521 serves as a carrier signal for the BLE transmitter and as a reference signal for the FLC 530. The FLC 530 calibrates a symbol oscillator 531 to output a symbol signal having a frequency of 1 MHz. The symbol signal is utilized to modulate the data to be transmitted.

Each of the FLCs 510, 520, and 530 can modulate the signal as discussed in detail above with reference to FIGS. 2 and 4. In this embodiment, the calibration is performed immediately prior to a transmission session, while the transmission all FLCs and oscillators are free running. To this end, each of the FLCs 510, 520 and 530 are enabled immediately prior to a transmission session.

It should be appreciated that the oscillator calibration circuit 500 demonstrates high frequency accuracy and low power consumption. This is because, the local oscillator 521 and symbol oscillator 531 are calibrated using a high frequency calibrated (auxiliary) reference signal, such as 2.4 GHz. As such, the calibration time is short, which results in less power consumption.

The utilization of the auxiliary oscillator allows for overcoming frequency pulling. This phenomenon occurs when the reference signal utilized to calibrate the local oscillator is received through the same antenna utilized to transit the carrier signal (generated by the local oscillator). Frequency pulling typically changes the oscillating frequency. By adding another calibration stage, through the auxiliary oscillator, the reception of the reference signal is decoupled from the transmission of the carrier signal.

It should be noted that the oscillator calibration circuit 500 can be configured in another arrangement. For example, the FLC 510 could be utilized for calibration of both FLCs 520 and 530

It should be further noted that the oscillator calibration circuits 500 and 200, designed according to the disclosed embodiments, do not include any explicit resonator component, such as a crystal resonator, a quartz resonator, or a MEMS-based resonator.

Figure 6:
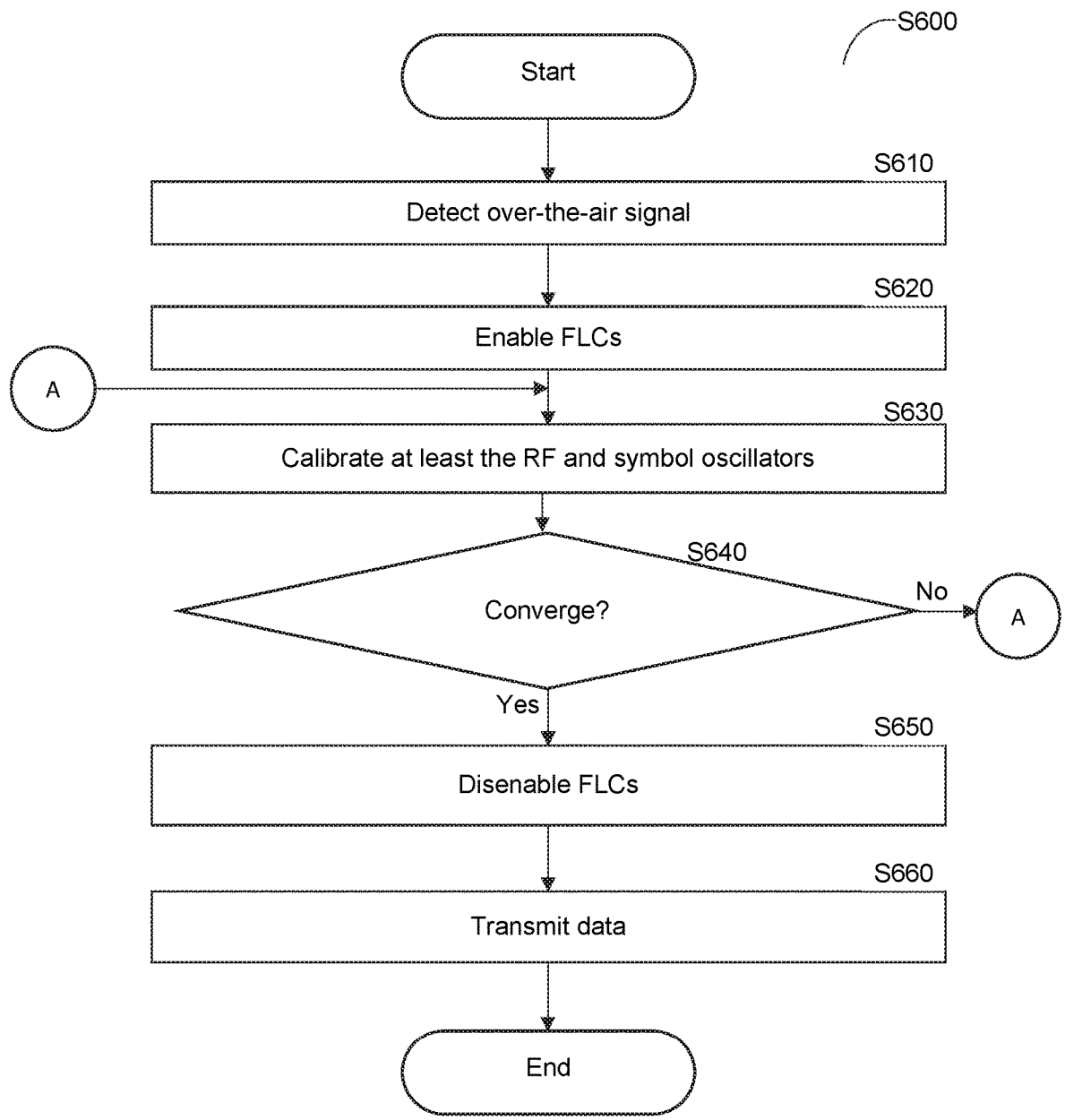
FIG. 6 is a flowchart of a method for calibrating an oscillator using over-the-air-signals according to an embodiment.

FIG. 6 shows an example flowchart 600 for calibrating an oscillator using over-the-air-signal according to an embodiment. The oscillator is operable in a wireless transmitter, such as, but not limited to, a BLE transmitter.

At S610, a signal received over the air is detected. In an embodiment, a detection event is triggered when a signal having a specific frequency is received. In another embodiment, a detection event is triggered when a packet is received over a specific channel of one of the BLE channels. In another embodiment, a detection event is triggered when the energy level of a received signal is over a predefined energy.

At S620, once a signal is detected, lock enable signals are triggered to enable at least FLCs for calibrating the RF and symbols oscillator. It should be noted that when an auxiliary oscillator is utilized, an FLC calibration coupled to such oscillator is enabled as well.

In an embodiment, all FLCs are activated at the same time to allow concurrent calibration of the oscillators. In another embodiment, the FLCs are sequentially calibrated. For example, the FLC calibrating the auxiliary oscillator is enabled, once the auxiliary oscillator is locked, and then the FLC calibrating the local oscillator is enabled. Finally, once the oscillator auxiliary is locked, the FLC calibrating the symbol oscillator is enabled.

At S630, at least the RF and symbol oscillators are calibrated to their target respective frequencies. At S640, it is checked if the RF and symbol oscillators have converged or otherwise locked on the target of their respective frequencies. If so, at S650, the FLCs are disenabled; otherwise, execution returns to S630. It should be noted that the calibration process is terminated if the oscillators are not converged after a predefined time interval or after the power consumption reaches a certain level. At S660, the data modulated using the symbol signal is transmitted over a carrier signal generated by the local oscillator.

It should be understood that any reference to an element herein using a designation such as "first," "second," and so forth does not generally limit the quantity or order of those elements. Rather, these designations are generally used herein as a convenient method of distinguishing between two or more elements or instances of an element. Thus, a reference to first and second elements does not mean that only two elements may be employed there or that the first element must precede the second element in some manner. Also, unless stated otherwise a set of elements comprises one or more elements. In addition, terminology of the form "at least one of A, B, or C" or "one or more of A, B, or C" or "at least one of the group consisting of A, B, and C" or "at least one of A, B, and C" used in the description or the claims means "A or B or C or any combination of these elements." For example, this terminology may include A, or B, or C, or A and B, or A and C, or A and B and C, or 2A, or 2B, or 2C, and so on.

All examples and conditional language recited herein are intended for pedagogical purposes to aid the reader in understanding the principles of the disclosed embodiments and the concepts contributed by the inventor to furthering the art, and are to be construed as being without limitation to such specifically recited examples and conditions. Moreover, all statements herein reciting principles, aspects, and embodiments, as well as specific examples thereof, are intended to encompass both structural and functional equivalents thereof. Additionally, it is intended that such equivalents include both currently known equivalents as well as equivalents developed in the future, i.e., any elements developed that perform the same function, regardless of structure.

What is claimed is:

1. An oscillator calibration circuit, comprising:
    a first frequency locking circuit (FLC) coupled to a first oscillator, wherein the first FLC calibrates the frequency of the first oscillator using an over-the-air reference signal, wherein the first FLC calibrates the first oscillator prior to a data transmission session and remains free running during the data transmission session; and
    a second FLC coupled to a second oscillator, wherein the second FLC calibrates the frequency of the second oscillator using the over-the-air reference signal, wherein the second FLC calibrates the second oscillator immediately prior to a data transmission session and remains free running during the data transmission session.

2. The oscillator calibration circuit of claim 1, wherein the first oscillator is a local oscillator being calibrated to any of: a radio frequency (RF) frequency and an intermediate frequency (IF) frequency.

3. The oscillator calibration circuit of claim 1, wherein the RF frequency is any one of: a single point carrier frequency, a single point carrier frequency ($f_o$) with a positive offset frequency value $\Delta_f$; a single point carrier frequency ($f_o$) with a negative offset frequency value $\Delta_f$; two calibration points having a carrier frequency ($f_o$) with a negative offset frequency value $\Delta_f$; and a carrier frequency ($f_o$) with a positive offset frequency value $\Delta_f$.

4. The oscillator calibration circuit of claim 3, wherein the oscillator calibration circuit operates in a Bluetooth low energy (BLE) transmitter, and wherein the carrier frequency is a frequency of a BLE advertisement channel, and the offset frequency value $\Delta_f$ is about 185 Khz.

5. The oscillator calibration circuit of claim 1, wherein the second oscillator is a symbol oscillator being calibrated to a modulation frequency.

6. The oscillator calibration circuit of claim 5, wherein the oscillator calibration circuit operates in a Bluetooth low energy (BLE) transmitter, and wherein the modulation frequency is 1 MHz.

7. The oscillator calibration circuit of claim 1, wherein the first FLC and the second FLC are enabled by enabled signals triggered upon detection of any one of: the reference signal having a specific frequency, an energy level of the energy signal is over a predefined value, and the reference signal is received over a specific channel.

8. The oscillator calibration circuit of claim 1, wherein each of the first FLC and the second FLC converge to a respective target frequency up to an allowed frequency error.

9. The oscillator calibration circuit of claim 8, wherein the allowed frequency error of the second FLC is smaller than the allowed frequency error of the first FLC.

10. The oscillator calibration circuit of claim 8, wherein the allowed frequency error is determined based on a device receiving transmitted data.

11. The oscillator calibration circuit of claim 1, wherein each of the first FLC and the second FLC is realized as any one of: a frequency locked loop (FLL), a phased locked loop (PLL), and a delay locked loop (DLL).

12. The oscillator calibration circuit of claim 1, wherein the over-the-air reference signal is derived from any one of: a constant-tone signal, a modulated signal, and a frequency-hopping signal.

13. The oscillator calibration circuit of claim 1, wherein the over-the-air reference signal is received through an antenna utilized for the data transmission.

14. The oscillator calibration circuit of claim 1, wherein the oscillator calibration circuit is operable in at least a Bluetooth low energy (BLE) transmitter.

15. The oscillator calibration circuit of claim 1, further comprises:
   a third FLC coupled to the second FLC and to a third oscillator, wherein the third FLC calibrates the frequency of the third oscillator using a third reference signal provided by the second oscillator.

16. The oscillator calibration circuit of claim 15, wherein each of the first FLC, the second FLC, and the third FLC respectively calibrates the first oscillator, the second oscillator, and the third oscillator prior to a data transmission session and remains free running during the data transmission session.

17. The oscillator calibration circuit of claim 15, wherein the first FLC calibrates the frequency of the second FLC and the third FLC using the first reference signal provided by the first oscillator.

* * * * *